(12) United States Patent
He et al.

(10) Patent No.: US 10,699,874 B2
(45) Date of Patent: Jun. 30, 2020

(54) VACUUM CONDITION CONTROLLING APPARATUS, SYSTEM AND METHOD FOR SPECIMEN OBSERVATION

(71) Applicant: Focus-eBeam Technology (Beijing) Co., Ltd., Beijing (CN)

(72) Inventors: Wei He, Beijng (CN); Shuai Li, Beijing (CN)

(73) Assignee: Focus-eBeam Technology (Beijing) Co., Ltd., Beijing (CN)

(*) Notice: Subject to any disclaimer, the term of this patent is extended or adjusted under 35 U.S.C. 154(b) by 0 days.

(21) Appl. No.: 15/741,240

(22) PCT Filed: Mar. 2, 2017

(86) PCT No.: PCT/CN2017/075465
§ 371 (c)(1),
(2) Date: Dec. 29, 2017

(87) PCT Pub. No.: WO2018/094903
PCT Pub. Date: May 31, 2018

(65) Prior Publication Data
US 2020/0035448 A1 Jan. 30, 2020

(30) Foreign Application Priority Data
Nov. 23, 2016 (CN) .......................... 2016 1 1038903

(51) Int. Cl.
*H01J 37/28* (2006.01)
*H01J 37/26* (2006.01)
*G01N 23/2251* (2018.01)

(52) U.S. Cl.
CPC .......... *H01J 37/28* (2013.01); *G01N 23/2251* (2013.01); *H01J 37/261* (2013.01); *H01J 2237/188* (2013.01); *H01J 2237/2605* (2013.01)

(58) Field of Classification Search
CPC .... H01J 37/28; H01J 37/261; H01J 2237/188; H01J 2237/2605; G01N 23/2251
(Continued)

(56) References Cited

U.S. PATENT DOCUMENTS

| 4,823,006 A | 4/1989 | Danilatos |
| 5,362,964 A | 11/1994 | Knowles |

(Continued)

FOREIGN PATENT DOCUMENTS

| CN | 1039324 A | 1/1990 |
| EP | 2672504 A | 12/2013 |
| WO | 2013129196 A1 | 9/2013 |

OTHER PUBLICATIONS

International Search Report in international application No. PCT/CN2017/075465, dated Aug. 18, 2017.
(Continued)

*Primary Examiner* — Nicole M Ippolito
(74) *Attorney, Agent, or Firm* — Syncoda LLC; Feng Ma

(57) ABSTRACT

A vacuum condition controlling apparatus, the top of which is connected with an electron beam generating instrument. The apparatus is rotationally symmetric, comprises the following parts deployed outward from the central axis: the central channel, the first pumping channel, the gas supplying chamber and the at least one pumping chamber. A pressure limiting aperture is deployed near the outlet of the central channel, for keeping the pressure difference between the central channel and the outside environment, and allow the electron beam to go through the central channel; the first pumping channel is connected to the central channel to pump the central channel; the top of the gas supplying chamber is connected to the gas supplying channel to supply gas to the area between the specimen and the apparatus; the
(Continued)

top of the second pumping channel is connected to the second pumping channel, to pump the area.

19 Claims, 11 Drawing Sheets

(58) Field of Classification Search
USPC .................. 250/306, 307, 309, 310, 311
See application file for complete search history.

(56) References Cited

U.S. PATENT DOCUMENTS

| | | | |
|---|---|---|---|
| 6,412,979 B1* | 7/2002 | Hell | A61B 6/035 378/130 |
| 6,710,354 B1 | 3/2004 | Koch | |
| 7,541,580 B2 | 6/2009 | Knowles | |
| 7,906,762 B2 | 3/2011 | Bierhoff | |
| 8,309,921 B2 | 11/2012 | Bierhoff | |
| 9,025,018 B2 | 5/2015 | Bierhoff | |
| 9,196,457 B2 | 11/2015 | Grogan | |
| 2003/0202449 A1 | 10/2003 | Miura | |
| 2005/0211925 A1 | 9/2005 | Nakasuji | |
| 2008/0035861 A1 | 2/2008 | Knowles | |
| 2010/0171037 A1 | 7/2010 | Bierhoff | |
| 2010/0194874 A1 | 8/2010 | Bierhoff | |
| 2010/0230590 A1 | 9/2010 | Bierhoff | |
| 2011/0133083 A1 | 6/2011 | Bierhoff | |
| 2012/0298883 A1 | 11/2012 | Grogan | |
| 2015/0332891 A1 | 11/2015 | Bierhoff | |
| 2016/0268097 A1 | 9/2016 | Rice et al. | |
| 2019/0279839 A1* | 9/2019 | Ohara | F16L 51/03 |

OTHER PUBLICATIONS

English Translation of the Written Opinion of the International Search Authority in international application No. PCT/CN2017/075465, dated Aug. 18, 2017.
Supplementary European Search Report in the European application No. 17826119.4, dated Nov. 29, 2019.

* cited by examiner

VACUUM CONDITION CONTROLLING APPARATUS, SYSTEM AND METHOD FOR SPECIMEN OBSERVATION

TECHNICAL FIELD

The present disclosure relates to the field of Scanning Electron Microscopes (SEM), and in particular to a vacuum condition controlling apparatus, as well as a system and method for specimen observation.

BACKGROUND

Optical microscope (OM) is widely used in scientific research, medical field and industrial production and so on. The advantages of OM observation mainly include: the convenience of specimen preparation, simple operations, adaptability to outside environment, diverse ways of observation and so on. However, when the scale of the objects goes down to less than half of the wavelength (about 200 nm), OM is no longer applicable due to light diffraction. In order to obtain a higher resolution, the scanning electron microscope (SEM) was invented in 1960's, and the resolution of SEM can reach to several nanometers even sub-nanometer scale.

However, there are many disadvantages with SEM, among which the complexities of specimen preparation and rigorous testing environment are the main factors precluding its popularity. For example, the objects to be observed are always put into a high-vacuum chamber, therefore many treatments to the specimens are necessary such as sampling, drying, freezing or coating. Therefore, there are many objects hard to observe with conventional SEM, including huge object, liquid specimens, in-vivo biological specimens and so on.

In order to solve the above problems, new kinds of SEMs or novel accessory structures for SEM have been developed, in which the environmental scanning electron microscope (ESEM) is a milestone. The original idea of ESEM called atmospheric scanning electron microscope (ASEM) is shown in the U.S. Pat. No. 4,596,928 with the title "method and apparatus for an atmospheric scanning electron microscope". After that ESEM has experienced a rapid development, the development relates to specimen preparation, detection method, and signal processing and so on.

Different from conventional SEM with a high-vacuum chamber (a typical pressure of less than $10^{-5}$ Torr), the ESEM usually has a gaseous environment with a high pressure typically between 0.1 Torr and 50 Torr. In this condition the specimen can be moist objects (such as biological specimens), non-conductive objects.

However, these ESEMs still have an enclosed space (specimen chamber or environmental cell), therefore observation is still difficult when it comes to huge specimen hard for sampling, or when frequent specimen exchange is necessary in line operations, which is common in industrial manufacture. SEM without specimen chamber is proposed to give an answer to this question. U.S. Pat. No. 4,596,928 with the invention called atmospheric scanning electron microscope (ASEM) provides the basic idea of SEM used in the open air without a specimen chamber. However, the key problem for SEM in the open air is that the mean free path (MFP) of electrons in the air is very small (tens or hundreds of micrometers), therefore the working distance of SEM is also very small that makes the SEM inapplicable. Besides how to create a gaseous environment and controlling the pressure in an open region without a chamber is also challenging. In the patent with Pub. No. US 2015/0380207 A1, one or more conduits are used to inject a gas, however, the pressure of the local gaseous environment is not stable and controllable. In addition, the pressure of the injected gas in the specimen region is a positive pressure, and hence the MFP will be smaller than that in one condition. All of these make this method very difficult in practical usage.

In conclusion, when the SEM is used in the open area without a specimen chamber, several problems need to solve include: how to create a local gaseous environment; and how to control the pressure of the area.

SUMMARY OF THE INVENTION

In view of this, embodiments according to the disclosure provide a vacuum condition controlling apparatus, as well as a system and method for specimen observation, capable of creating a desired local gaseous environment surrounding a specimen area under observation.

A technical solution according to an embodiment herein may be implemented as follows.

According to an embodiment of the disclosure, a vacuum condition controlling apparatus is provided, the top of the apparatus is connected to an electron beam generation instrument, the apparatus is rotationally symmetric, and comprises: a central channel, a first pumping channel connected to an external first pumping system, a gas supplying chamber connected to an external gas supplying system, and at least one second pumping chamber connected to an external second pumping system, the central channel, the first pumping channel, the gas supplying chamber, and the at least one second pumping chamber being deployed successively outward from the central axis; a pressure limiting aperture is deployed at an outlet of the central channel, for keeping a pressure difference between the central channel and an external environment, and allowing an electron beam generated from the electron beam generating instrument to pass through and impinge a specimen to be tested; the first pumping channel is connected to the central channel, and is used for pumping the central channel; a first gas outlet is deployed at bottom of the gas supplying chamber, the top of the gas supplying chamber is connected to a gas supplying channel for supplying gas to an area between the specimen to be tested and the apparatus via the gas supplying chamber; and a second gas outlet is deployed at bottom of the second pumping chamber, the top of the second pumping chamber is connected to one end of the second pumping channel, another end of the second pumping channel is connected to the second pumping channel for pumping the area between the specimen to be tested and the apparatus via the at least one second pumping chamber.

The pressure in the central channel may be less than 0.1 Torr. A length of the central channel may be less than 100 millimeters.

Each of the first gas outlet and the second gas outlet at their respective bottoms, may have an outlet in form of an array of holes or a ring.

The vacuum condition controlling apparatus may be supplied with a pure gas or a mixture of gases.

The vacuum condition controlling apparatus may further include at least one third pumping chamber between the first pumping channel and the gas supplying chamber, at least one third pumping chamber being connected to an external third pumping system, wherein the top of the third pumping chamber is connected to a third pumping channel, so as to pump the area between the specimen to be tested and the apparatus.

According to an embodiment of the disclosure, a system for specimen observation is provided, which includes a Scanning Electron Microscope (SEM), a vacuum condition controlling apparatus, and a specimen.

The bottom of a column of the SEM is fixedly connected to the top of the vacuum condition controlling apparatus.

The specimen is placed at a first distance from the bottom of the vacuum condition controlling apparatus.

The vacuum condition controlling apparatus is rotationally symmetric about a central axis. The vacuum condition controlling apparatus includes a central channel, a first pumping channel connected to an external first pumping system, a gas supplying chamber connected to an external gas supplying system, and a second pumping chamber connected to an external second pumping system. The central channel, the first pumping channel, the gas supplying chamber, and the second pumping chamber are deployed successively outward from the central axis. a pressure limiting aperture is deployed near an outlet of the central channel, for keeping a pressure difference between the central channel and an external environment, and allowing an electron beam generated from the electron beam generating instrument to pass through and impinge a specimen to be tested; the first pumping channel is connected to the central channel, and is used for pumping the central channel; a first gas outlet is deployed at bottom of the gas supplying chamber, the top of the gas supplying chamber is connected to a gas supplying channel for supplying gas to an area between the specimen to be tested and the vacuum condition controlling apparatus via the gas supplying chamber; and the top of the second pumping chamber is connected to one end of the second pumping channel, the second pumping channel pumps the area between the specimen to be tested and the apparatus via the second pumping chamber.

The bottom of the column of the SEM may be connected to the top of the vacuum condition controlling apparatus using a bolt. The connection may be sealed using an O-ring.

The pressure in the central channel may be less than 0.1 Torr. A length of the central channel may be less than 100 millimeters.

Each of the first gas outlet and the second gas outlet may be in form of an array of holes or a ring.

The vacuum condition controlling apparatus may be supplied with a pure gas or a mixture of gases.

The vacuum condition controlling apparatus may further include at least one third pumping chamber between the first pumping channel and the gas supplying chamber, the at least one third pumping chamber being connected to an external third pumping system, wherein the top of the third pumping chamber is connected to a third pumping channel, so as to pump the area between the specimen to be tested and the apparatus.

The system for specimen observation may further include at least one detector, wherein the detector is deployed at the bottom of the central channel and embedded into the bottom of the vacuum condition controlling apparatus, or the detector is deployed inside the central channel.

The system for specimen observation may further include a positioning platform for adjusting the first distance between the specimen and the vacuum condition controlling apparatus.

The system for specimen observation may further include a height adjusting apparatus connected to the SEM. The height adjusting apparatus may be used for adjusting a height of the SEM.

According to an embodiment of the disclosure, a method for specimen observation applies to a Scanning Electron Microscope (SEM) system. The SEM system includes an SEM, a vacuum condition controlling apparatus, and a specimen. The vacuum condition controlling apparatus is rotationally symmetric about a central axis. The vacuum condition controlling apparatus includes a central channel, a first pumping channel connected to an external first pumping system, a gas supplying chamber connected to an external gas supplying system, and a second pumping chamber connected to an external second pumping system. The central channel, the first pumping channel, the gas supplying chamber, and the second pumping chamber are deployed successively outward from the central axis. The method for specimen observation includes: creating a local gaseous environment in an area between the vacuum condition controlling apparatus and the specimen by the first pumping channel, the gas supplying chamber and the second pumping chamber, and controlling a pressure of the area between the vacuum condition controlling apparatus and the specimen; and generating, by the SEM, an electron beam, which passes through a pressure limiting aperture in the central channel and then impinges the specimen to achieve observation of the specimen.

The controlling a pressure of the area between the specimen and the vacuum condition controlling apparatus may include: pumping, by the first pumping system, the central channel via the first pumping channel, supplying, by the gas supplying system, gas to the area between the vacuum condition controlling apparatus and the specimen via a gas supplying channel connected to the top of the gas supplying chamber, and pumping, by the second pumping system, the area between the vacuum condition controlling apparatus and the specimen via the second pumping chamber.

The vacuum condition controlling apparatus may further include at least one third pumping chamber between the first pumping channel and the gas supplying chamber. The at least one third pumping chamber may be connected, via a third pumping channel connected to the top of the at least one third pumping chamber, to an external third pumping system. The controlling a pressure in the area between the specimen and the vacuum condition controlling apparatus may further include: pumping, by the third pumping system, the area between the vacuum condition controlling apparatus and the specimen via the at least one third pumping chamber.

The system may further include at least one detector deployed at the bottom of the central channel and embedded into the bottom of the vacuum condition controlling apparatus, or at least one detector deployed inside the central channel. The method for specimen observation may further include: detecting, with the at least one detector, a signal produced from interaction between the electron beam and the specimen.

The SEM system may further include at least one of a positioning platform connected to the specimen and a height adjusting apparatus connected to the SEM. The method for specimen observation may further include adjusting a working distance of the SEM by at least one of: adjusting, by the positioning platform, a distance between the specimen and the vacuum condition controlling apparatus, and adjusting, by the height controlling device, a height of the SEM, to achieve adjustment of a working distance of the SEM.

Embodiments of the disclosure provide a vacuum condition controlling apparatus, as well as a system and method for specimen observation. The top of the vacuum condition controlling apparatus is connected to an electron beam generation instrument. The vacuum condition controlling apparatus is rotationally symmetric about a central axis. The vacuum condition controlling apparatus includes a central channel, a first pumping channel connected to an external first pumping system, a gas supplying chamber connected to an external gas supplying system, and at least one second pumping chamber connected to an external second pumping system. The central channel, the first pumping channel, the gas supplying chamber, and the at least one second pumping chamber are deployed successively outward from the central axis. A pressure limiting aperture is provided at an outlet of the central channel, for maintaining a difference between a pressure in the central channel and an environmental pressure and allowing an electron beam generated by the electron beam generation instrument to pass through the central channel and irradiate a specimen to be detected. The first pumping channel is connected to the central channel, and is used for pumping the central channel. A first gas outlet is provided at the bottom of the gas supplying chamber, and the top of the gas supplying chamber is connected to a gas supplying channel for supplying gas to an area between the specimen and the vacuum condition controlling apparatus via the gas supplying chamber. A second gas outlet is provided at the bottom of the at least one second pumping chamber, the top of the at least one second pumping chamber is connected to an end of a second pumping channel; the other end of the second pumping channel is connected to the second pumping system for pumping the area between the specimen and the vacuum condition controlling apparatus via the at least one second pumping chamber. Hence, a local gaseous environment with a desired pressure is created in the area between the specimen and the vacuum condition controlling apparatus by supplying gas to the vacuum condition controlling apparatus using the gas supplying system, pumping the central channel using the first pumping system, and pumping the area between the specimen and the vacuum condition controlling apparatus using the second pumping system. In addition, the pressure in the area of the specimen under observation may be controlled by adjusting the pumps and/or a pumping speed of the first pumping system and the second pumping system, thereby creating a desired local gaseous environment surrounding a specimen area under observation.

DETAILED DESCRIPTION OF THE EMBODIMENTS

The details are described as follows with reference to the figures and several embodiments.

Embodiment 1

Figure 1:
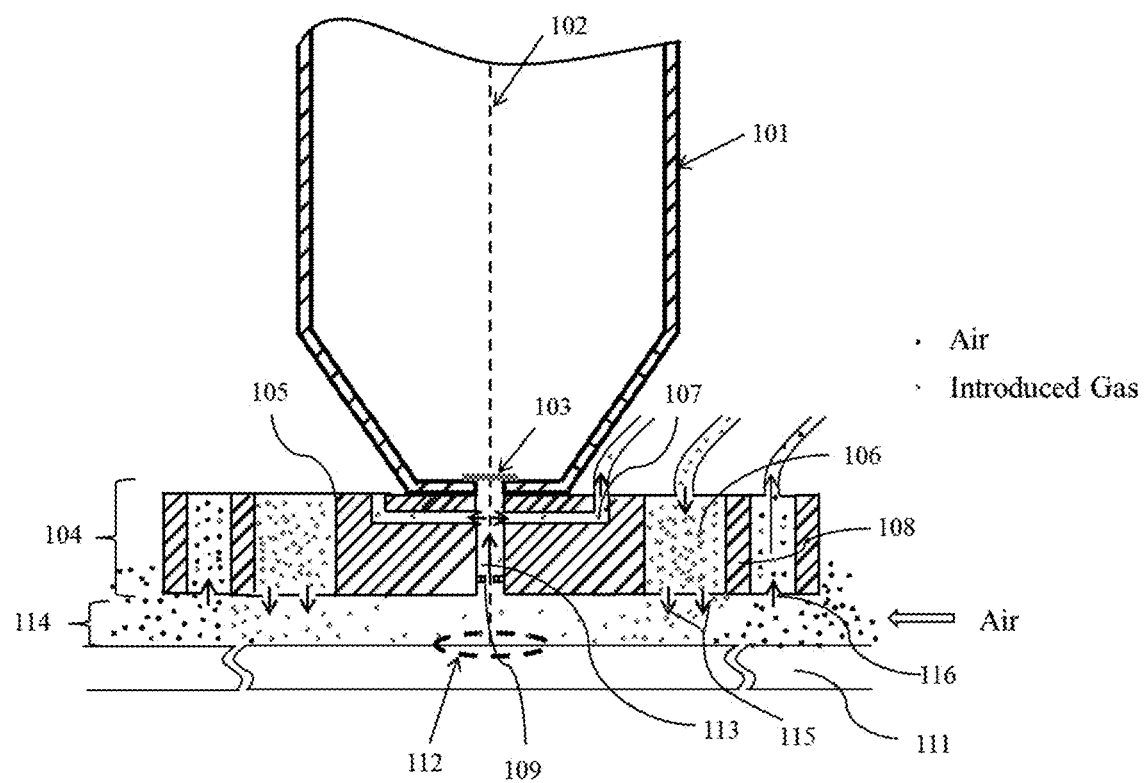
FIG. 1 is a diagram of a sectional view of a structure of a vacuum condition controlling apparatus according to Embodiment 1 of the disclosure.

FIG. 1 is a diagram of a sectional view of a structure of a vacuum condition controlling apparatus 104 according to Embodiment 1 of the disclosure. The top of the vacuum condition controlling apparatus 104 is connected to the bottom of an external electron beam generation instrument. The vacuum condition controlling apparatus is rotationally symmetric, about a central axis. The vacuum condition controlling apparatus may be a cylinder, a rotationally symmetric cuboid, a rotationally symmetric polyhedron, etc. The vacuum condition controlling apparatus has a central axis. The vacuum condition controlling apparatus includes a central channel 113, a first pumping channel 107 connected to an external first pumping system, a gas supplying chamber 106 connected to an external gas supplying system, and at least one second pumping chamber 108 connected to an external second pumping system, the central channel. The first pumping channel, the gas supplying chamber, and the at least one second pumping chamber are deployed successively outward from the central axis A pressure limiting aperture 109 is deployed rotationally symmetric about the central axis near an outlet of the central channel 113. An electron beam generated by the electron beam generation instrument passes through a column 101, the central channel 113 and the pressure limiting aperture 109 and then impinges a surface of the specimen 111. The pressure limiting aperture 109 may keep the central channel 113 at a higher degree of vacuum to reduce electron scattering before the electron beam reaches the surface of the specimen 111.

One end of the first pumping channel 107 is connected to the first pumping system. The other end of the first pumping channel is connected to the central channel 113. The first pumping system may include one or more pumps operating independently to better control a vacuum condition. The first pumping system may pump the central channel 113 through the first pumping channel 107.

The top of the gas supplying chamber 106 may be connected to one end of a gas supplying channel. The other end of the gas supplying channel may be connected to the gas supplying system. The gas supplying system may supply, via the gas supplying channel, gas to the gas supplying chamber 106, and further to an area between the specimen and the vacuum condition controlling apparatus. In FIG. 1, black dots represent air, and gray dots represent gas supplied by the external gas supplying system. A density of the dots represents a density of gas molecules or a gas pressure.

The at least one second pumping chamber 108 is provided, at the bottom of the at least one second pumping chamber, with a second gas outlet 116. The at least one second pumping chamber is connected, at the top of the at least one second pumping chamber, to an end of a second pumping channel. The other end of the second pumping channel is connected to the second pumping system. The second pumping system may include one or more pumps operating independently. The second pumping system may pump, via the second pumping channel, the area 114 between the specimen 111 and the vacuum condition controlling apparatus.

There may be one or more second pumping chambers 108. When there are more than one pumping chambers 108, the second pumping chambers 108 may be deployed centered around the central axis successively outside the gas supplying chamber 106.

According to an embodiment of the disclosure, the gas supplying system may supply the gas supplying chamber 106 with a pure gas or a mixture of gases. A pure gas may be He, Ar, $N_2$, $H_2O$, $O_2$, etc. A mixture of gases may be that of He and $H_2O$, for example.

According to an embodiment of the disclosure, the gas supplying system may supply He, because a Mean Free Path (MFP) of an electron in He is greater than that in another gas. In this case, the SEM may operate at a greater working distance (WD), which facilitates observation of a large-size specimen.

According to an embodiment of the disclosure, the gas supplying chamber 106 is provided, at the bottom of the gas supplying chamber, with a first gas outlet 115. The first gas outlet 115 may supply gas to the area 114 between the specimen 111 and the vacuum condition controlling apparatus. According to FIG. 1, the gas supplied to the area 114 may be pumped out through the first pumping channel 107 through the central channel 113, or through the second pumping chamber 108. Therefore, the gas may flow to both a central area and the second pumping chamber. The central area may refer to an area near an area 112 of the specimen under observation. In this way, it may be guaranteed that the central area under detection 112 is in a desired gaseous environment, i.e., a desired condition, while preventing ambient air from entering the central area under detection 112. In addition, by pumping the second pumping chamber 108 via the second pumping channel, massive amount of air may be prevented from going into the central area under detection, improving an accuracy in observing the specimen 111.

According to an embodiment of the disclosure, a length of the central channel 113, that is, a thickness of the vacuum condition controlling apparatus 104, is preferred to be small. The length of the central channel 113 may be less than 30 mm. The length of the central channel 113 may be less than 10 mm.

According to an embodiment of the disclosure, a pressure in the central channel 113 may be preferred to be small. The pressure in the central channel 113 may be less than 0.1 Torr. The pressure in the central channel 113 may be less than $10^{-2}$ Torr. The pressure in the central channel 113 may be less than $10^{-3}$ Torr.

Figure 2:
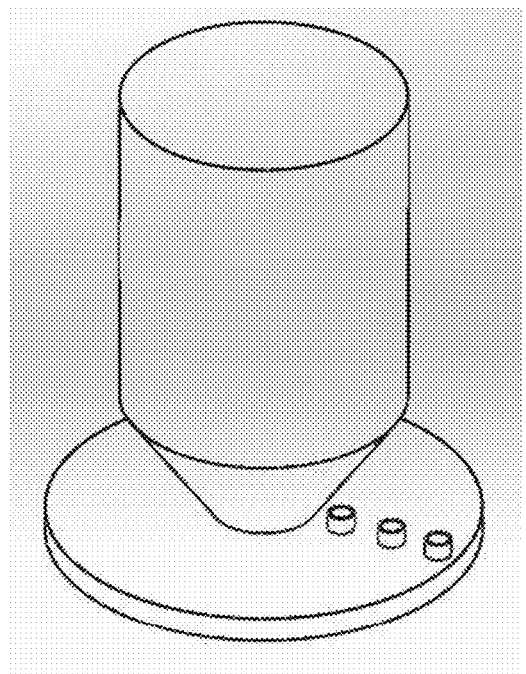
FIG. 2 is a diagram of an external structure of a vacuum condition controlling apparatus connected to an SEM, according to an embodiment of the disclosure.

According to an embodiment of the disclosure shown in FIG. 1, the electron beam generating device may be an SEM. FIG. 2 is a diagram of an external structure of a vacuum condition controlling apparatus connected to an SEM, according to an embodiment of the disclosure. The upper surface 105 of the vacuum condition controlling apparatus 104 may match the lower surface of the column 101 of the SEM. The match parts may be fixedly connected to each other using a bolt. The connection may be sealed using a sealing apparatus such as an O-ring. In this way, the vacuum condition controlling apparatus 104 may be installed or removed with ease. According to an embodiment of the disclosure, the specimen 111 may be large in size with an approximately flat surface. According to an embodiment of the disclosure, a high-vacuum chamber inside the column 101 of the SEM may be sealed using a membrane at the bottom of the column 101. The membrane may separate the high-vacuum column 101 from a lab environment of 1 ATM. The membrane may withstand the pressure difference at both sides to allow the electron beam to pass through as much as possible. The membrane may be made of a material such as SiN, $SiO_2$, graphene, etc.

Figure 3:
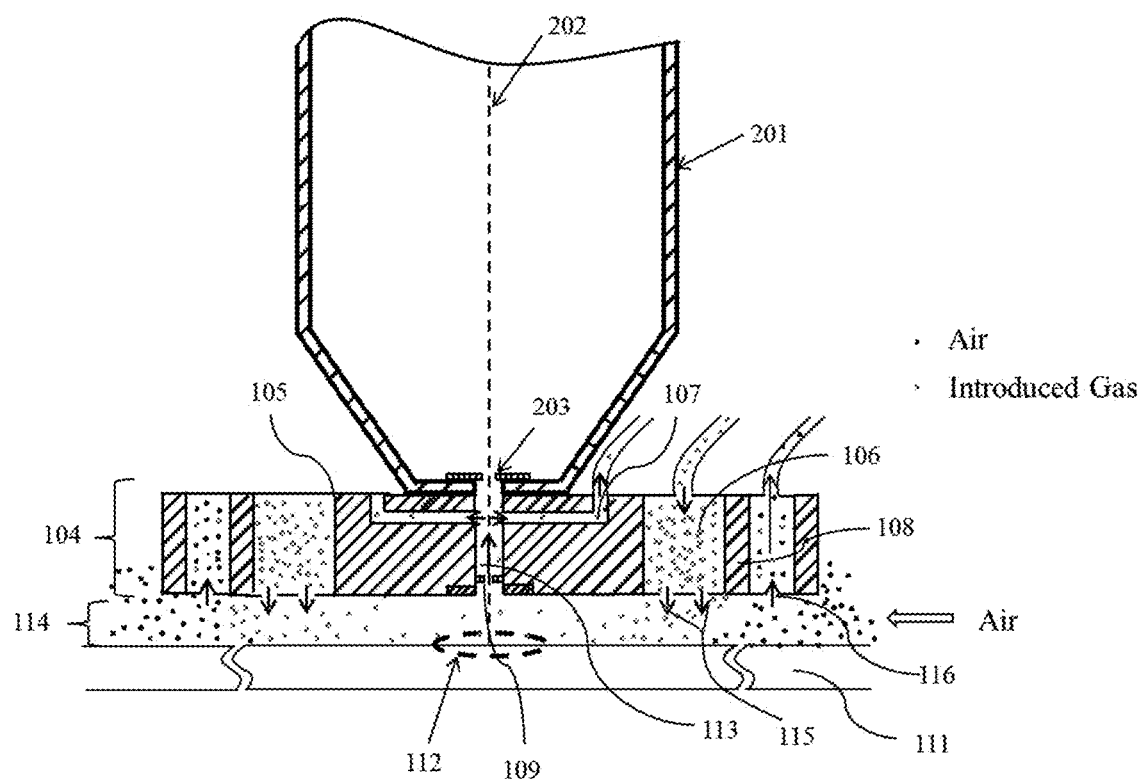
FIG. 3 is a diagram of a sectional view of an SEM according to an embodiment of the disclosure.

According to an embodiment of the disclosure, the SEM may be provided, at the bottom of the SEM, with one or more pressure limiting apertures (PLA) instead of the membrane. As shown in FIG. 3, the bottom of the column 201 of the SEM may be provided with a PLA 203. The PLA 203 may be deployed symmetrically about an axis 202 of the column 201 of the SEM.

Figure 4A:
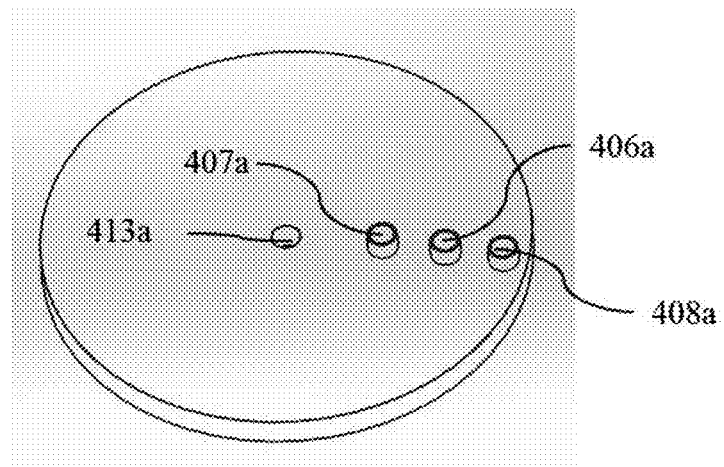
FIG. 4A is a diagram of an end face of a structure of a vacuum condition controlling apparatus according to an embodiment of the disclosure.

FIG. 4A is a diagram of an end face of a structure of a vacuum condition controlling apparatus according to an embodiment of the disclosure. 413a may represent the inlet for the electron beam. 407a may represent the first pumping channel. 406a may represent the gas supplying channel. 408a may represent the second pumping channel.

Figure 4B:
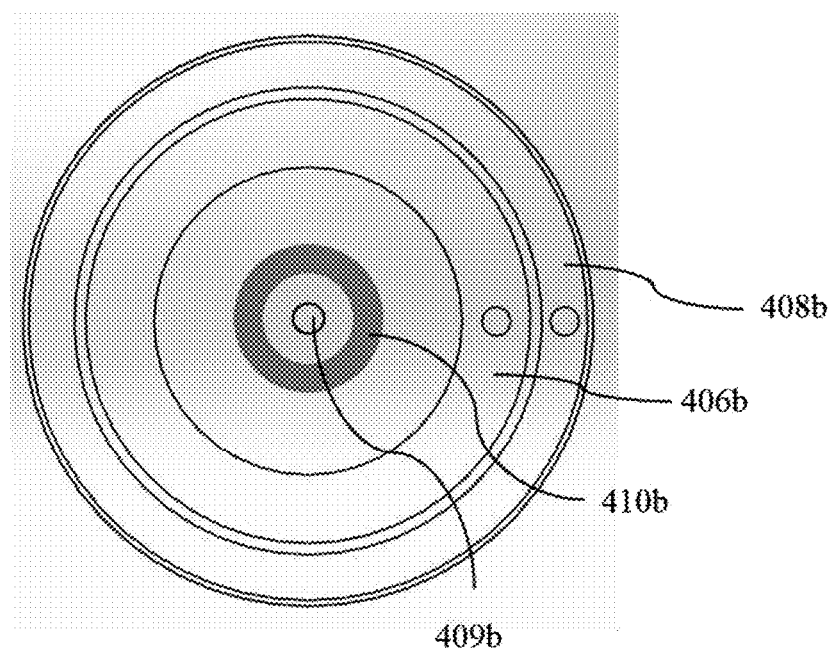
FIG. 4B is a diagram of an inlet/outlet of a channel according to an embodiment of the disclosure.
Figure 4C:
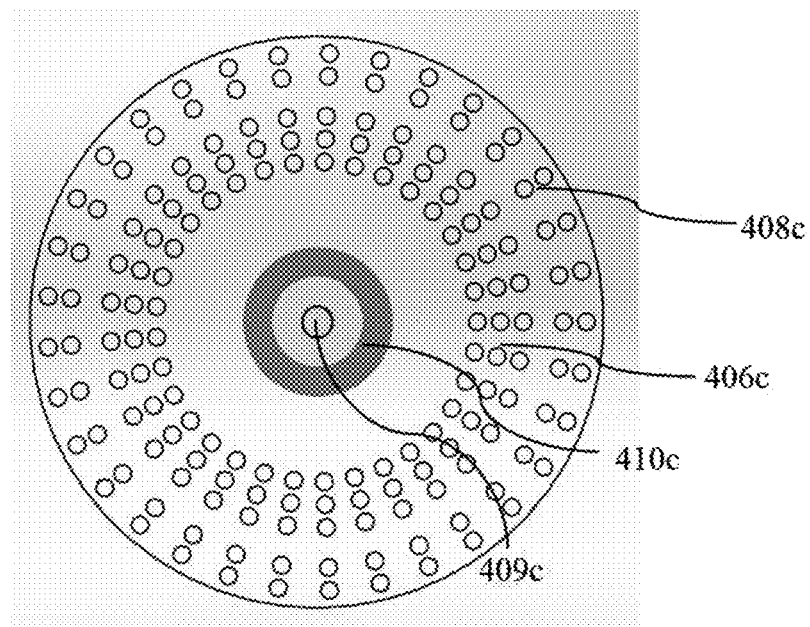
FIG. 4C is a diagram of an inlet/outlet of a channel according to an embodiment of the disclosure.

FIGS. 4B and 4C each show channel openings at the lower surface of a vacuum condition controlling apparatus according to an embodiment of the disclosure. As shown in FIG. 4B, except for the electron beam outlet 409b of the central channel, both the opening of the gas supplying chamber 406b and that of the second pumping channel 408b may be of a ring shape. As shown in FIG. 4C, the openings of the gas supplying channel 406c and the openings of the second pumping channel 408c may be in form of an array of holes. The holes may include, but are not limited to, circular holes, square holes, polygonal holes, etc.

According to an embodiment of the disclosure, a local gaseous environment with a desired pressure is created in the area between the specimen and the vacuum condition controlling apparatus by supplying gas to the vacuum condition controlling apparatus using the gas supplying system, pumping the central channel using the first pumping system, and pumping the area between the specimen and the vacuum condition controlling apparatus using the second pumping system. In addition, the pressure in the area 112 of the specimen under observation may be controlled to vary between one ATM to a fraction (such as several tenths) of a Torr by adjusting the pumps and/or a pumping speed of the first pumping system and the second pumping system, thereby creating a desired local gaseous environment surrounding a specimen area under observation.

Embodiment 2

Figure 5:
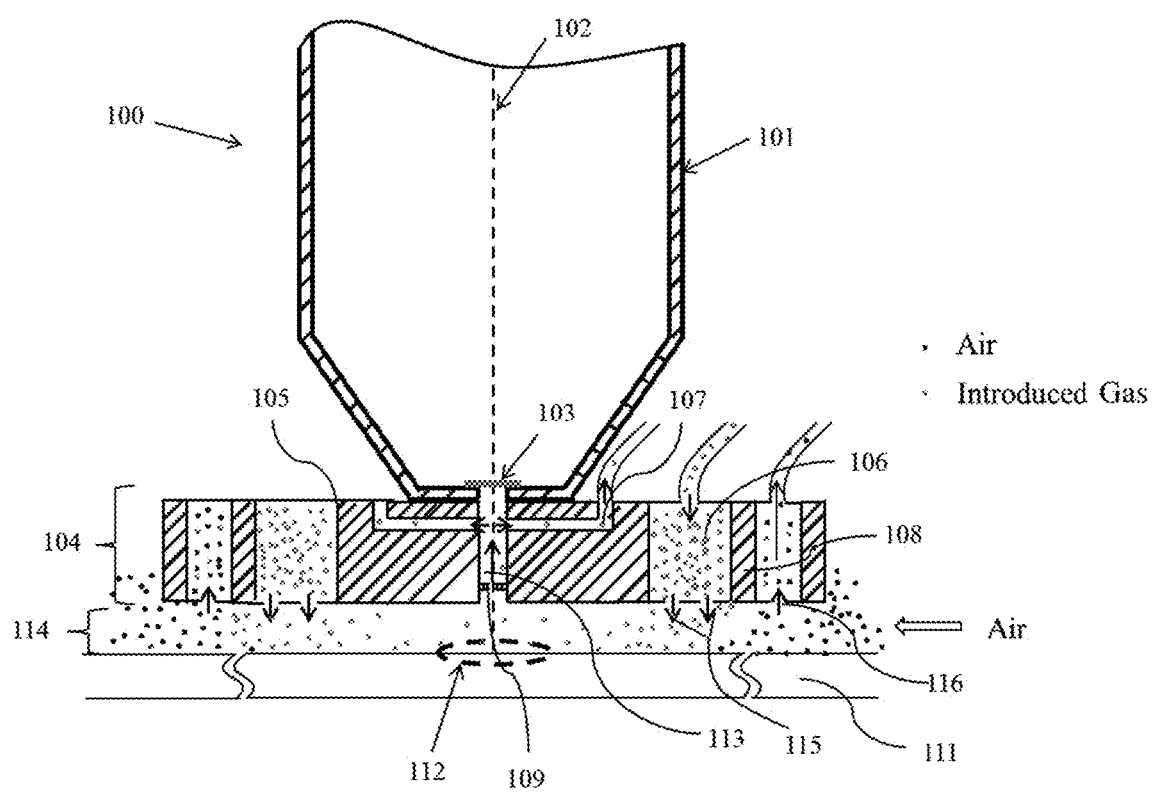
FIG. 5 is a diagram of a sectional view of a structure of a vacuum condition controlling apparatus according to Embodiment 2 of the disclosure.

FIG. 5 is a diagram of an external structure of a vacuum condition controlling apparatus connected to an SEM, according to an embodiment of the disclosure. The top of the vacuum condition controlling apparatus 104 is connected to the bottom of the external SEM. The vacuum condition controlling apparatus is rotationally symmetric, about a central axis. The vacuum condition controlling apparatus may be a cylinder, an rotationally symmetric cuboid, an rotationally symmetric polyhedron, etc. The vacuum condition controlling apparatus has a central axis. The vacuum condition controlling apparatus includes a central channel 113, a first pumping channel 107 connected to an external first pumping system, a gas supplying chamber 106 connected to an external gas supplying system, and at least one second pumping chamber 108 connected to an external second pumping system, the central channel. The first pumping channel, the gas supplying chamber, and the at least one second pumping chamber are deployed successively outward from the central axis. The vacuum condition controlling apparatus may further include at least one detector 110.

A pressure limiting aperture 109 is deployed rotationally symmetric about the central axis at an outlet of the central channel 113. An electron beam generated by the SEM passes through a column 101, the central channel 113 and the pressure limiting aperture 109 and then impinges a surface of the specimen 111. The pressure limiting aperture 109 may keep the central channel 113 at a higher degree of vacuum to reduce electron scattering before the electron beam reaches the surface of the specimen 111.

One end of the first pumping channel 107 is connected to one end of the first pumping system. The other end of the first pumping channel is connected to the central channel 113. The first pumping system may include one or more pumps operating independently. The first pumping system may pump the central channel 113 through the first pumping channel 107.

The top of the gas supplying chamber 106 may be connected to one end of a gas supplying channel. The other end of the gas supplying channel may be connected to the gas supplying system. The gas supplying system may supply, via the gas supplying channel, gas to the gas supplying chamber 106, and further to the area between the specimen and the vacuum condition controlling apparatus. In FIG. 5, black dots represent air, and gray dots represent gas supplied by the external gas supplying system. A density of the dots represents a density of gas molecules or a gas pressure.

The at least one second pumping chamber 108 is provided, at the bottom of the at least one second pumping chamber, with a second gas outlet 116. The at least one second pumping chamber is connected, at the top of the at least one second pumping chamber, to an end of a second pumping channel. The other end of the second pumping channel is connected to the second pumping system. The second pumping system may include one or more pumps operating independently. The second pumping system may pump, via the second pumping channel, the area 114 between the specimen 111 and the vacuum condition controlling apparatus.

There may be one or more second pumping chambers 108. When there are more than one pumping chamber 108, the second pumping chambers 108 may be deployed centered around the central axis successively outside the gas supplying chamber 106.

The at least one detector 110 may be deployed below the central channel 113, and embedded in the bottom of the vacuum condition controlling apparatus 104, or deployed inside the central channel 113.

According to an embodiment of the disclosure, there may be one or more detectors. The at least one detector may include a secondary electron detector, a backscattered electron detector, a gas detector, etc.

According to an embodiment of the disclosure, the at least one detector 110 may be of a shape of, but not limited to, a ring as shown by 410b in FIG. 4B and by 410c in FIG. 4C.

In one embodiment of the invention shown in FIG. 5, the lower surface of the detector 110 coincides with the bottom surface of the apparatus 110, or the detector is embedded in the apparatus 104 with surface of the detector lower than the surface of the apparatus 104; in this way the collision of the detector 110 with the specimen 111, leading to the contamination of the detector, can be prevented.

According to the embodiment of the invention, the type of gas supplied to the chamber 106 by the gas supplying system can be pure gas or mixed gas; in which the pure gas can be He, Ar, $N_2$, $H_2O$, $O_2$ and so on; the mixed gas can be He and $H_2O$ as an example;

According to a preferred embodiment of the invention, the injected gas prefers to be He, because the mean free path (MFP) of the electrons in He is bigger than that in other gases; in this condition the SEM has a larger working distance (WD), which facilitates the observation of specimen with large size.

According to the embodiment of the invention, the first outlet 115 is deployed at the gas supplying chamber 106, the first outlet 115 allows the apparatus to supply gas to the area between the specimen 111 and the apparatus; according to FIG. 1 the injected gas at area 114 between the specimen 111 and the apparatus can be pumped out through the first pumping channel 107 through the central channel 113, or from the second pumping chamber 108; therefore the gas flows to both the central area and the second pumping chamber, wherein the central area refers to the area near the detection position on the specimen; in this way, it can be guaranteed that the central detection area 112 is in an ideal gaseous environment, and that the air at the outside of the apparatus can be prevented to enter this area; meanwhile the pumping with the second pumping chamber 108 can prevent the air from going to the central detection area, and therefore improve the observation resolution.

According to the embodiment of the invention, the length of the central channel 113, that is the thickness of the apparatus 104, is preferred to be less than 30 mm, and the more preferred length is less than 10 mm.

According to this embodiment, the preferred pressure of the central channel 113 is less than $10^{-1}$ Torr, a more preferred pressure is less than $10^{-2}$ Torr, the most preferred pressure is less than $10^{-3}$ Torr.

According to this embodiment shown in FIG. 1, the electron beam generating device is a scanning electron microscope (SEM) as an example, FIG. 2 shows the structure of the assembly of the vacuum condition controlling apparatus and the SEM, the upper surface of the apparatus 104 is attached to the bottom of the SEM column and linked together via bolt connection with O-ring sealed; in this way the installment and removing of the apparatus 104 is convenient; the specimen 111 has a large size and a nearly flat surface a according to the embodiment of the invention; and in this embodiment the high-vacuum SEM column is sealed with a membrane at the bottom, the membrane can withstand the pressure difference and allow the electron beam to pass through as much as possible; the material of the membrane can be SiN, $SiO_2$ or graphene membrane.

In another embodiment of the invention, one or several pressure limiting aperture (PLA) is deployed at the bottom of the SEM column instead of sealing with the membrane. As is shown in FIG. 3, the bottom of the SEM column 201 is structured with a PLA 203, the PLA 203 is deployed symmetrically about the central line 202 of the SEM column 201.

FIG. 4A is a diagram of an end face of a structure of a vacuum condition controlling apparatus according to an embodiment of the disclosure. 413a may represent the inlet for the electron beam. 407a may represent be the first pumping channel. 406a may represent the gas supplying channel. 408a may represent the second pumping channel.

FIGS. 4B and 4C each show channel openings at the lower surface of a vacuum condition controlling apparatus according to an embodiment of the disclosure. As shown in FIG. 4B, except for the electron beam outlet 409b of the central channel, both the opening of the gas supplying chamber 406b and that of the second pumping channel 408b may be of a ring shape. As shown in FIG. 4C, the openings of the gas supplying channel 406c and the openings of the second pumping channel 408c may be in form of an array of holes. The holes may include, but are not limited to, circular holes, square holes, polygonal holes, etc.

According to an embodiment of the disclosure, a local gaseous environment with a desired pressure is created in the area between the specimen and the vacuum condition controlling apparatus by supplying gas to the vacuum condition controlling apparatus using the gas supplying system, pumping the central channel using the first pumping system, and pumping the area between the specimen and the vacuum condition controlling apparatus using the second pumping system. In addition, the pressure in the area 112 of the specimen under observation may be controlled to vary between one ATM to a fraction (such as several tenths) of a Torr by adjusting the pumps and/or a pumping speed of the first pumping system and the second pumping system, thereby creating a desired local gaseous environment surrounding a specimen area under observation.

Embodiment 3

Figure 6:
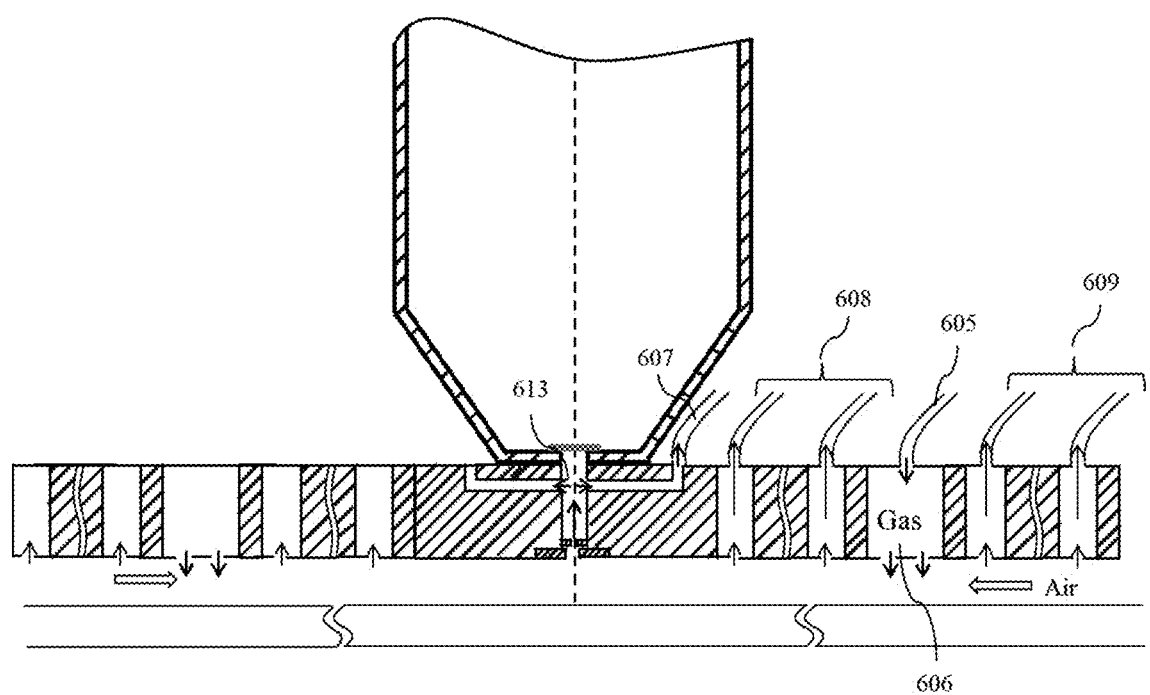
FIG. 6 is a diagram of a sectional view of a structure of a vacuum condition controlling apparatus according to Embodiment 3 of the disclosure.

Based on the vacuum condition controlling apparatus according to Embodiment 1 and Embodiment 2, an improved vacuum condition controlling apparatus may be provided according to Embodiment 3 of the disclosure. FIG. 6 is a diagram of a sectional view of the vacuum condition controlling apparatus 104. The vacuum condition controlling apparatus in this embodiment may include more than one second pumping chamber 609, and one or more pumping chambers 608 may be added between the first pumping channel and the gas supplying chamber according to Embodiment 1 or Embodiment 2.

According to an embodiment of the disclosure, an external pumping system connected to a pumping channel may include one or more pumps operating independently to better control a vacuum condition.

Since the vacuum condition controlling apparatus according to Embodiment 3 is based on that according to Embodiment 1 and Embodiment 2, all features of the vacuum condition controlling apparatus according to Embodiment 1 and Embodiment 2 apply to this embodiment.

Embodiment 4

FIG. 5 shows a sectional view of a structure of a system for specimen observation according to Embodiment 4. The system for specimen observation includes an SEM 100, a vacuum condition controlling apparatus 104, and a specimen 111.

The top of the vacuum condition controlling apparatus 104 is connected to the bottom of the SEM 100. The vacuum condition controlling apparatus 104 is rotationally symmetric, about a central axis. The vacuum condition controlling apparatus may be a cylinder, an rotationally symmetric cuboid, an rotationally symmetric polyhedron, etc. The vacuum condition controlling apparatus has a central axis. The vacuum condition controlling apparatus includes a central channel 113, a first pumping channel 107 connected to an external first pumping system, a gas supplying chamber 106 connected to an external gas supplying system, and at least one second pumping chamber 108 connected to an external second pumping system, the central channel. The first pumping channel, the gas supplying chamber, and the at least one second pumping chamber are deployed successively outward from the central axis.

A pressure limiting aperture 109 is deployed rotationally symmetric about the central axis at an outlet of the central channel 113. An electron beam generated by the electron beam generation instrument passes through a column 101, the central channel 113 and the pressure limiting aperture 109 and then impinges the surface of the specimen. The pressure limiting aperture 109 may keep the central channel 113 at a higher degree of vacuum to reduce electron scattering before the electron beam reaches the surface of the specimen 111.

One end of the first pumping channel 107 is connected to the first pumping system. The other end of the first pumping channel is connected to the central channel 113. The first pumping system may include one or more pumps operating independently to better control a vacuum condition. The first pumping system may pump the central channel 113 through the first pumping channel 107.

The top of the gas supplying chamber 106 may be connected to one end of a gas supplying channel. The other end of the gas supplying channel may be connected to the gas supplying system. The gas supplying system may supply, via the gas supplying channel, gas to the gas supplying chamber 106, and further to an area between the specimen and the vacuum condition controlling apparatus. In FIG. 1, black dots represent air, and gray dots represent gas supplied by the external gas supplying system. A density of the dots represents a density of gas molecules or a gas pressure.

The at least one second pumping chamber 108 is provided, at the bottom of the at least one second pumping chamber, with a second gas outlet 116. The at least one second pumping chamber 108 is connected, at the top of the at least one second pumping chamber, to an end of a second pumping channel. The other end of the second pumping channel is connected to the second pumping system. The second pumping system may include one or more pumps operating independently. The second pumping system may pump, via the second pumping channel, the area 114 between the specimen 111 and the vacuum condition controlling apparatus.

There may be one or more second pumping chambers 108. When there are more than one pumping chamber 108, the second pumping chambers 108 may be deployed centered around the central axis successively outside the gas supplying chamber 106.

According to an embodiment of the disclosure, the gas supplying system may supply the gas supplying chamber 106 with a pure gas or a mixture of gases. A pure gas may be He, Ar, $N_2$, $H_2O$, $O_2$, etc. A mixture of gases may be that of He and $H_2O$, for example.

According to an embodiment of the disclosure, the gas supplying system may supply He, because an MFP of an electron in He is greater than that in another gas.

In this case, the SEM may operate at a greater working distance (OD), which facilitates observation of a large-size specimen.

According to an embodiment of the disclosure, the gas supplying chamber 106 is provided, at the bottom of the gas supplying chamber, with a first gas outlet 115. The first gas outlet 115 may supply gas to the area 114 between the specimen 111 and the vacuum condition controlling apparatus. According to FIG. 1, the gas supplied to the area 114 may be pumped out through the first pumping channel 107 through the central channel 113, or through the second pumping chamber 108. Therefore, the gas may flow to both a central area and the second pumping chamber. The central area may refer to an area near an area 112 of the specimen under observation. In this way, it may be guaranteed that the central area under detection 112 is in a desired gaseous environment, while preventing ambient air from entering the central area under detection 112. In addition, by pumping gas via the second pumping chamber 108, massive amount of air may be prevented from going into the central area under detection, improving an accuracy in observing the specimen 111.

According to an embodiment of the disclosure, a length of the central channel 113, that is, a thickness of the vacuum condition controlling apparatus 104, is preferred to be small. The length of the central channel 113 may be less than 30 mm. The length of the central channel 113 may be less than 10 mm.

According to an embodiment of the disclosure, a pressure in the central channel 113 may be preferred to be small. The pressure in the central channel 113 may be less than 0.1 Torr. The pressure in the central channel 113 may be less than $10^{-2}$ Torr. The pressure in the central channel 113 may be less than $10^{-3}$ Torr.

According to an embodiment of the disclosure shown in FIG. 1, the electron beam generating device may be an SEM. FIG. 2 is a diagram of an external structure of a vacuum condition controlling apparatus connected to an SEM, according to an embodiment of the disclosure. The upper surface 105 of the vacuum condition controlling apparatus 104 may match the lower surface of the column 101 of the SEM. The match parts may be fixedly connected to each other using a bolt. The connection may be sealed using a sealing apparatus such as an O-ring. In this way, the vacuum condition controlling apparatus 104 may be installed or removed with ease. According to an embodiment of the disclosure, the specimen 111 may be large in size with an approximately flat surface. According to an embodiment of the disclosure, a high-vacuum chamber inside the column 101 of the SEM may be sealed using a membrane at the bottom of the column 101. The membrane may separate the high-vacuum column 101 from a lab environment of 1 ATM. The membrane may withstand the pressure difference at both sides to allow the electron beam to pass through as much as possible. The membrane may be made of a material such as SiN, SiO2, graphene, etc.

According to an embodiment of the disclosure, the SEM may be provided, at the bottom of the SEM, with one or more pressure limiting apertures (PLA) instead of a membrane. As shown in FIG. 3, the bottom of the column 201 of the SEM may be provided with a PLA 203. The PLA 203 may be deployed symmetrically about an axis 202 of the column 201 of the SEM.

FIG. 4A is a diagram of an end face of a structure of a vacuum condition controlling apparatus according to an embodiment of the disclosure. 413a may be the inlet for the electron beam. 407a may be the first pumping channel. 406a may be the gas supplying channel. 408a may be the second pumping channel.

FIGS. 4B and 4C each show channel openings at the lower surface of a vacuum condition controlling apparatus according to an embodiment of the disclosure. As shown in FIG. 4B, except for the electron beam outlet 409b of the central channel, both the opening of the gas supplying chamber 406b and that of the second pumping channel 408b may be of a ring shape. As shown in FIG. 4C, the openings of the gas supplying channel 406c and the openings of the second pumping channel 408c may be in form of an array of holes. The holes may include, but are not limited to, circular holes, square holes, polygonal holes, etc.

According to an embodiment of the disclosure, a local gaseous environment with a desired pressure is created in the area between the specimen and the vacuum condition controlling apparatus by supplying gas to the vacuum condition controlling apparatus using the gas supplying system, pumping the central channel using the first pumping system, and pumping the area between the specimen and the vacuum condition controlling apparatus using the second pumping system. In addition, the pressure in the area 112 of the specimen under observation may be controlled to vary between one ATM to a fraction (such as several tenths) of a Torr by adjusting the pumps and/or a pumping speed of the first pumping system and the second pumping system, thereby creating a desired local gaseous environment surrounding a specimen area under observation.

Embodiment 5

Figure 7:
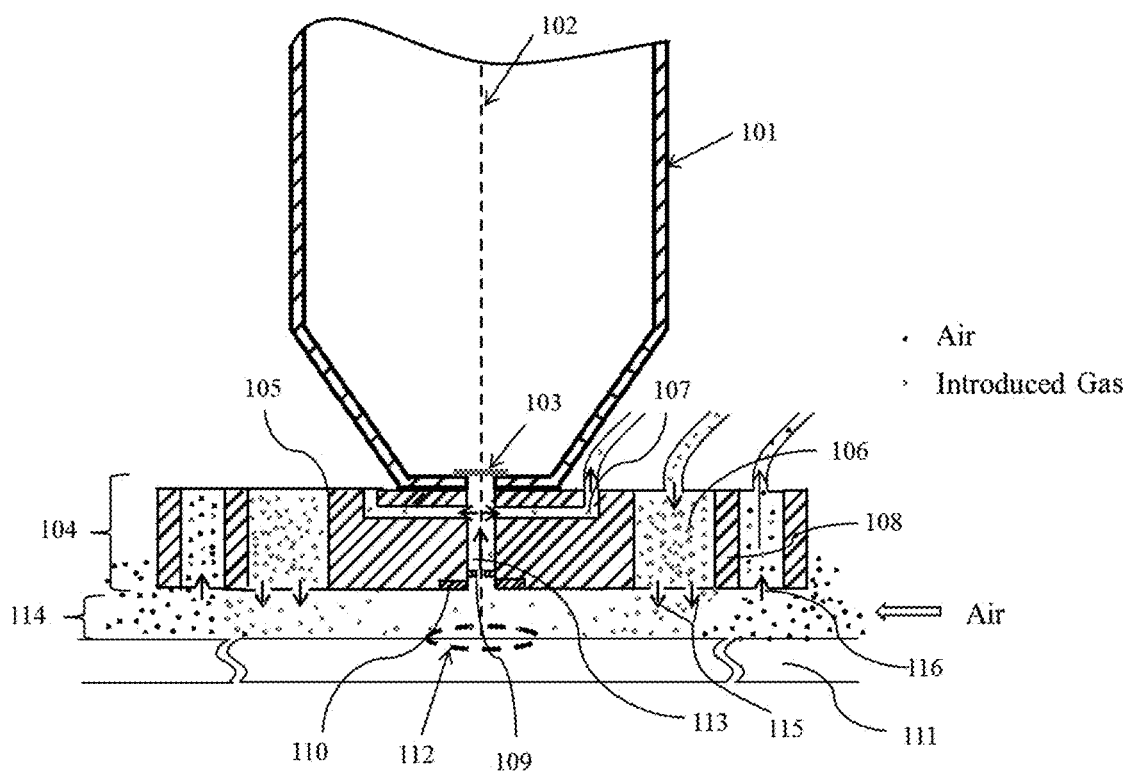
FIG. 7 is a diagram of a structure of a system for sample observation according to Embodiment 4 of the disclosure.

Based on the system for specimen observation according to Embodiment 4, a system for specimen observation as shown in FIG. 7 may further be provided according to Embodiment 5 by adding one or more detectors to the system for specimen observation as shown in FIG. 5. The at least one detector 110 may be deployed below the central channel 113, and embedded in the bottom of the vacuum condition controlling apparatus 104, or deployed inside the central channel 113.

According to an embodiment of the disclosure, there may be one or more detectors. The at least one detector may include a secondary electron detector, a backscattered electron detector, a gas detector, etc.

According to an embodiment of the disclosure, the at least one detector 110 may be of a shape of, but not limited to, a ring shown by 410b in FIG. 4B and by 410c in FIG. 4C.

According to an embodiment of the disclosure as shown in FIG. 5, the lower surface of the at least one detector 110 may coincide with the lower surface of the vacuum condition controlling apparatus 110, or the at least one detector may be embedded in the vacuum condition controlling apparatus 104, such that the lower surface of the at least one detector is lower than the lower surface of the vacuum condition controlling apparatus 104, thereby preventing the at least one detector 110 from being contaminated or damaged due to contact with the specimen 111.

According to an embodiment of the disclosure, an external pumping system connected to a pumping channel may include one or more pumps operating independently to better control a vacuum condition.

Since the system for specimen observation according to Embodiment 5 is based on that according to Embodiment 4, all features of the system for specimen observation according to Embodiment 4 apply to this embodiment.

Embodiment 6

Based on the system for specimen observation according to Embodiment 4 and Embodiment 5, a system for specimen observation, as shown in FIG. 6, may be provided according to Embodiment 6 by adding one or more pumping chambers to the system for specimen observation according to Embodiment 4 or 5. A cross section of the system for specimen observation is shown in FIG. 6. The system for specimen observation may include: a central channel 613; a pumping channel 607 connected to the central channel 613 for pumping the central channel 613; pumping chambers 608 and 609 connected to at least one external pumping system external for pumping the area between the specimen and the vacuum condition controlling apparatus; and a gas supplying chamber 606 connected to a gas supplying channel 605.

Since the system for specimen observation according to Embodiment 6 is based on that according to Embodiment 4 or 5, all features of the system for specimen observation according to Embodiment 4 or 5 apply to this embodiment.

Embodiment 7

Based on the system for specimen observation according to Embodiment 4, Embodiment 5, and Embodiment 6, the Embodiment 7 of the disclosure may provide a system for specimen observation, further including at least one of a positioning platform connected to the specimen and a height adjusting apparatus connected to the SEM. The positioning platform may be used for adjusting the distance between the specimen and the vacuum condition controlling apparatus. The height adjusting apparatus may be used for adjusting the height of the SEM. The positioning platform may be any displacement adjusting apparatus capable of adjusting the distance between the sample and the vacuum atmosphere controlling apparatus.

Figure 8:
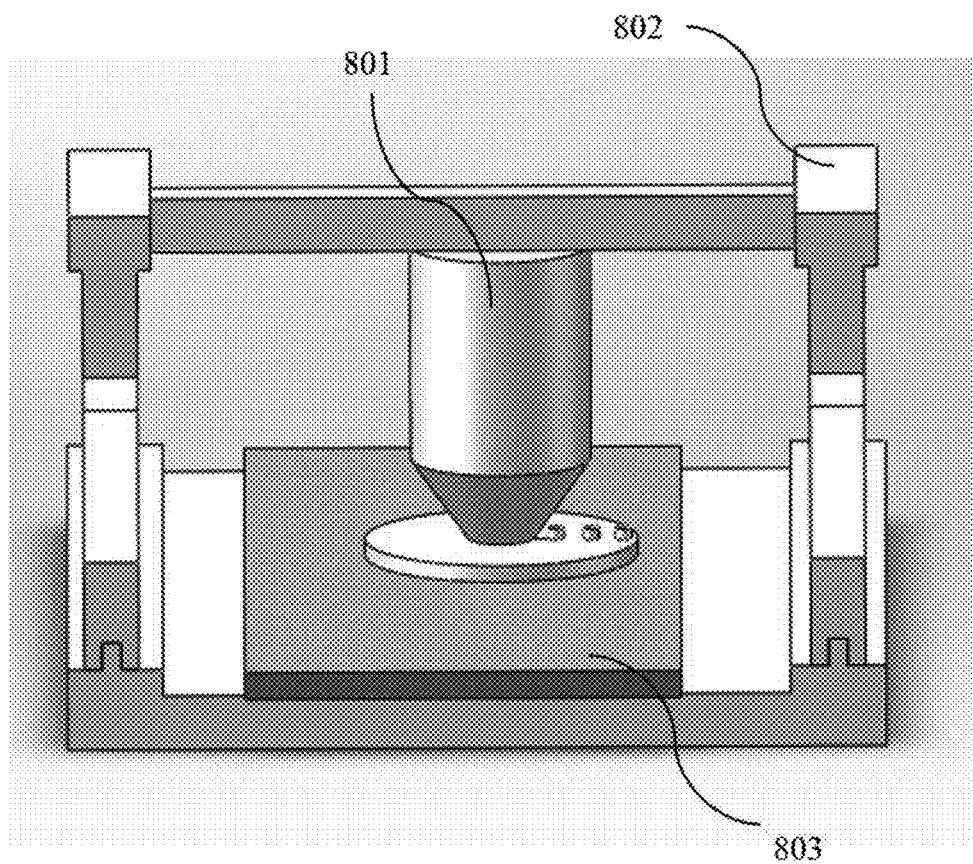
FIG. 8 is a diagram of an SEM provided with a gantry according to Embodiment 7 of the disclosure.

In an embodiment of the disclosure, the height adjusting apparatus may be a gantry-type structure or a mechanical arm through which the height of the SEM may be adjusted, thereby adjusting the working distance of the SEM. FIG. 8 is a diagram of an SEM 801 provided with a gantry-type structure 802. 803 designates a specimen.

In this embodiment, the working distance of the SEM may be controlled by adjusting the positioning platform connected to the specimen, and/or adjusting the height of the apparatus.

Since the system for specimen observation according to Embodiment 7 is based on that according to Embodiment 4, 5, or 6, all features of the system for specimen observation according to Embodiment 4, 5, or 6 apply to this embodiment.

Embodiment 8

Figure 9:
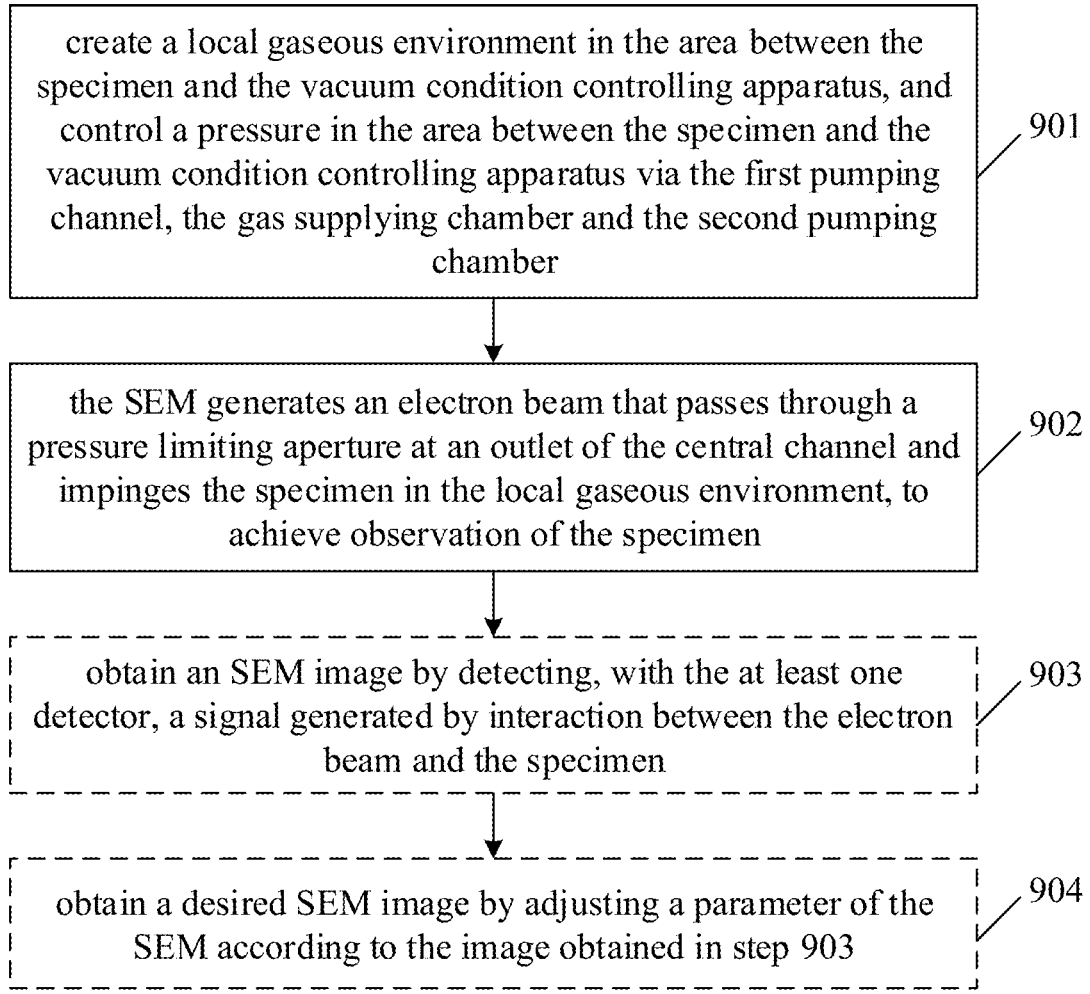
FIG. 9 is a flowchart of a method for sample observation according to Embodiment 8 of the disclosure.

Based on the vacuum condition controlling apparatus and the system for specimen observation according to aforementioned embodiments, Embodiment 8 of the disclosure provides a method for specimen observation including, as shown in FIG. 9, steps as follows.

In Step 901, a local gaseous environment is created in the area between the specimen and the vacuum condition controlling apparatus, and a pressure in the area between the specimen and the vacuum condition controlling apparatus is controlled via the first pumping channel, the gas supplying chamber and the second pumping chamber.

The first pumping system may pump, via the first pumping channel, the central channel. The gas supplying system may supply, via a gas supplying channel, gas to the vacuum condition controlling apparatus. The second pumping system may pump, via the second pumping chamber, the area between the specimen and the vacuum condition controlling apparatus, such that a local gaseous environment with a desired pressure is created in the area between the specimen and the vacuum condition controlling apparatus. In addition, the pressure in the area 112 of the specimen under observation may be controlled by adjusting the pumps and/or a pumping speed of the first pumping system and the second pumping system, thereby creating a desired local gaseous environment surrounding a specimen area under observation.

A pumping system of the disclosure may be one or more pumps operating independently. Therefore, the pumping system may be single-platform or multiplatform. The gas supplying system may supply the gas supplying chamber 106 with a pure gas or a mixture of gases. A pure gas may be He, Ar, $N_2$, $H_2O$, $O_2$, etc. A mixture of gases may be that of He and $H_2O$, for example.

There may be one or more second pumping chambers. When there are more than one pumping chamber, the second pumping chambers may be deployed centered around the central axis successively outside the gas supplying chamber.

According to an embodiment of the disclosure, the gas supplying system may supply He, because an MFP of an electron in He is greater than that in another gas. In this case, the SEM may operate at a greater working distance.

With a gas pumping system and a gas supplying system according to an embodiment of the disclosure, the gas may flow to both a central area and the second pumping chamber. The central area may refer to an area near an area of the specimen under observation. In this way, it may be guaranteed that the central area under detection is in a desired gaseous environment, i.e., a desired condition, while preventing ambient air from entering the central area under detection. In addition, by pumping gas via the second pumping channel, massive amount of air may be prevented from going into the central area under detection, improving an accuracy in observing the specimen.

In Step 902, the SEM generates an electron beam that passes through a pressure limiting aperture at an outlet of the central channel and impinges the specimen in the local gaseous environment, such that the specimen is observed.

According to an embodiment of the disclosure, the vacuum condition controlling apparatus further comprises at least one third pumping chamber between the first pumping channel and the gas supplying chamber. The at least one third pumping chamber may be connected, via a third pumping channel connected to the top of the at least one third pumping chamber, to an external third pumping system. Accordingly, Step 901 may further include a step as follows.

the third pumping system may pump, via the at least one third pumping chamber, the area between the specimen and the vacuum condition controlling apparatus.

According to an embodiment of the disclosure, the SEM system further comprises at least one detector deployed below the central channel and embedded in the bottom of the vacuum condition controlling apparatus, or deployed inside the central channel. Accordingly, the method may further include the step as follows.

In Step 903, an SEM image may be obtained by detecting, with the at least one detector, a signal produced from interaction between the electron beam and the specimen.

There may be one or more detectors. The at least one detector may include a secondary electron detector, a backscattered electron detector, a gas detector, etc. The at least one detector 110 may be of a shape of, but not limited to, a ring as shown by 410*b* in FIG. 4B and by 410*c* in FIG. 4C. As is shown in FIG. 5, the lower surface of the at least one detector 110 may coincide with the lower surface of the vacuum condition controlling apparatus 110, or the at least one detector may be embedded in the vacuum condition controlling apparatus 104, such that the lower surface of the at least one detector is lower than the lower surface of the vacuum condition controlling apparatus 104, thereby preventing the at least one detector 110 from being contaminated or damaged due to contact with the specimen 111. According to an embodiment of the disclosure, the system for specimen observation may further include at least one of a positioning platform connected to the specimen and a height adjusting apparatus connected to the SEM. Accordingly, the method may further include the step as follows.

In Step 904, a desired SEM image may be obtained by adjusting a parameter of the SEM according to the image obtained in step 903.

At least one of the distance between the specimen and the vacuum condition controlling apparatus, the speed of a gas supplying system and of a gas pumping system of the disclosure, and the type and proportion of the gas supplied may be adjusted according to quality of the SEM image, until a desired SEM image is obtained.

The first distance between the specimen and the vacuum condition controlling apparatus may be adjusted using the positioning platform. The height of the SEM may be adjusted using the height adjusting apparatus.

The positioning platform may be used for adjusting the first distance between the specimen and the vacuum condition controlling apparatus. The height adjusting apparatus may be used for adjusting the height of the SEM. The height adjusting apparatus may be a gantry-type structure or a mechanical arm through which the height of the SEM may be adjusted, thereby adjusting the working distance of the SEM. FIG. 8 is a diagram of an SEM 801 provided with a gantry-type structure 802. 803 designates a specimen.

The working distance of the SEM may be controlled by adjusting the positioning platform connected to the specimen, and/or adjusting the height of the apparatus.

What described are merely embodiments of the disclosure, and not intended to limit the scope of protection of the disclosure.

INDUSTRIAL APPLICABILITY

With the vacuum condition controlling apparatus, as well as the system and method for specimen observation according to the disclosure, a local gaseous environment with a desired pressure is created in the area between the specimen and the vacuum condition controlling apparatus by supplying gas to the vacuum condition controlling apparatus using the gas supplying system, pumping the central channel using the first pumping system, and pumping the area between the specimen and the vacuum condition controlling apparatus using the second pumping system. In addition, the pressure in the area of the specimen under observation may be controlled by adjusting the pumps and/or a pumping speed of the first pumping system and the second pumping system, thereby creating a desired local gaseous environment surrounding a specimen area under observation.

The invention claimed is:

1. A vacuum condition controlling apparatus, wherein a top of the apparatus is connected to an electron beam generation instrument, the apparatus is rotationally symmetric, and comprises: a central channel, a first pumping channel connected to an external first pumping system, a gas supplying chamber connected to an external gas supplying system, and at least one second pumping chamber connected to an external second pumping system, the central channel, the first pumping channel, the gas supplying chamber, and the at least one second pumping chamber being deployed successively outward from the central axis;

wherein a pressure limiting aperture is deployed at an outlet of the central channel, for keeping a pressure difference between the central channel and an external environment, and allowing an electron beam generated from the electron beam generating instrument to pass through and impinge a specimen to be tested;

wherein the first pumping channel is connected to the central channel, and is used for pumping the central channel;

wherein a first gas outlet is deployed at bottom of the gas supplying chamber, a top of the gas supplying chamber is connected to a gas supplying channel for supplying gas to an area between the specimen to be tested and the apparatus via the gas supplying chamber; and wherein a second gas outlet is deployed at bottom of the second pumping chamber, a top of the second pumping chamber is connected to one end of the second pumping channel, another end of the second pumping channel is connected to the second pumping channel for pumping the area between the specimen to be tested and the apparatus via the at least one second pumping chamber.

2. The vacuum condition controlling apparatus according to claim 1, wherein a pressure of the central channel is less than $10^{-1}$ Torr, and a length of the central channel is less than 100 millimeters.

3. The vacuum condition controlling apparatus according to claim 1, wherein each of the gas supplying chamber and the second pumping channel, at their respective bottoms, has an outlet in form of an array of holes or a ring.

4. The vacuum condition controlling apparatus according to claim 1, wherein the vacuum condition controlling apparatus is supplied with pure gas or mixed gas.

5. The vacuum condition controlling apparatus according to claim 1, wherein the apparatus further comprises at least one third pumping chamber between the first pumping channel and the gas supplying chamber, at least one third pumping chamber being connected to an external third pumping system, wherein a top of the third pumping chamber is connected to a third pumping channel, so as to pump the area between the specimen to be tested and the apparatus.

6. A specimen observation system comprising: a scanning electron microscope (SEM), a vacuum condition controlling apparatus and a specimen, wherein a bottom of a column of the SEM is fixedly connected to a top of the vacuum condition controlling apparatus;

wherein the specimen is placed at a first distance from a bottom of the vacuum condition controlling apparatus;

wherein the apparatus is rotationally symmetric, and comprises a central channel, a first pumping channel connected to an external first pumping system, a gas supplying chamber connected to an external gas supplying system, and at least one second pumping chamber connected to an external second pumping system, the central channel, the first pumping channel, the gas supplying chamber, and the second pumping chamber being deployed successively outward from the central axis;

wherein a pressure limiting aperture is deployed near an outlet of the central channel, for keeping a pressure difference between the central channel and an external environment, and allowing an electron beam generated from the electron beam generating instrument to pass through and impinge a specimen to be tested;

wherein the first pumping channel is connected to the central channel, and is used for pumping the central channel;

wherein a first gas outlet is deployed at bottom of the gas supplying chamber, a top of the gas supplying chamber is connected to a gas supplying channel for supplying gas to an area between the specimen to be tested and the vacuum condition controlling apparatus via the gas supplying chamber; and wherein a top of the second pumping chamber is connected to one end of the second pumping channel, the second pumping channel pumps the area between the specimen to be tested and the apparatus via the second pumping chamber.

7. The system according to claim 6, wherein the bottom of the column of the SEM is connected to a top of the vacuum condition controlling apparatus using a bolt and the connection is sealed using a sealing device.

8. The system according to claim 6, wherein a pressure of the central channel is less than $10^{-1}$ Torr, and a length of the central channel is less than 100 millimeters.

9. The system according to claim 6, wherein each of the gas supplying chamber and the second pumping channel, at their respective bottoms, has an outlet in form of an array of holes or a ring.

10. The system according to claim 6, wherein the vacuum condition controlling apparatus is supplied with pure gas or mixed gas.

11. The system according to claim 6, wherein the vacuum condition controlling apparatus further comprises at least one third pumping chamber between the first pumping channel and the gas supplying chamber, the at least one third pumping chamber being connected to an external third pumping system, wherein a top of the third pumping chamber is connected to a third pumping channel, so as to pump the area between the specimen to be tested and the apparatus.

12. The system according to claim 6, wherein the system further comprises at least one detector, wherein the detector is deployed at a bottom of the central channel and embedded into the bottom of the vacuum condition controlling apparatus, or the detector is deployed inside the central channel.

13. The system according to claim 6, wherein the system further comprises a positioning platform for adjusting a first distance between the specimen and the vacuum condition controlling apparatus.

14. The system according to claim 6, wherein the system further comprises a height adjustment device connected to the SEM and for adjusting a height of the SEM.

15. A specimen observation method, applied to a scanning electron microscope (SEM) system comprising: an SEM, a vacuum condition controlling apparatus and a specimen, the vacuum condition controlling apparatus is rotationally symmetric, and comprises a central channel, a first pumping channel connected to an external first pumping system, a gas supplying chamber connected to an external gas supplying system, and at least one second pumping chamber connected to an external second pumping system, the central channel, the first pumping channel, the gas supplying chamber, and the second pumping chamber being deployed successively outward from the central axis, wherein the method comprises:

using the first pumping channel, the gas supplying chamber and the second pumping chamber to create a local gaseous environment in an area between the vacuum condition controlling apparatus and the specimen;

controlling a pressure of the area between the vacuum condition controlling apparatus and the specimen; and generating an electron beam from the SEM, passing the electron beam through a pressure limiting aperture in the central channel and impinging the specimen to achieve observation of the specimen.

16. The method according to claim 15, wherein controlling a pressure of the area between the vacuum condition controlling apparatus and the specimen comprises:

using the first pumping system to pump the central channel via the first pumping channel, using the gas supplying system to supply gas to the area between the vacuum condition controlling apparatus and the specimen via a gas supplying channel connected to a top of the gas supplying chamber, and using the second pumping system to pump the area between the vacuum condition controlling apparatus and the specimen via the second pumping chamber.

17. The method according to claim 16, wherein the apparatus further comprises: between the first pumping channel and the gas supplying chamber, at least one third pumping chamber connected to an external third pumping system, wherein the third pumping chamber is connected to a third pumping channel, and wherein controlling a pressure of the area between the vacuum condition controlling apparatus and the specimen further comprises:

using the third pumping system to pump the area between the vacuum condition controlling apparatus and the specimen via the at least one third pumping chamber.

18. The method according to claim 15, wherein the system further comprises at least one detector deployed at a bottom of the central channel and embedded into a bottom of the vacuum condition controlling apparatus, or at least one detector deployed inside the central channel, and wherein the method further comprises: using the detector to detect a signal produced from interaction between the electron beam and the specimen.

19. The method according to claim 15, wherein the system further comprises at least one of a positioning platform connected to the specimen and a height controlling device connected to the SEM, and wherein the method further comprises at least one of:
using the positioning platform to adjust a distance between the specimen and the vacuum condition controlling apparatus, and using the height controlling device to adjust a height of the SEM, to achieve adjustment of a working distance of the SEM.

* * * * *